(12) United States Patent
Schustereder et al.

(10) Patent No.: US 9,934,988 B2
(45) Date of Patent: Apr. 3, 2018

(54) METHOD FOR PROCESSING A SILICON WAFER

(71) Applicant: Infineon Technologies AG, Neubiberg (DE)

(72) Inventors: Werner Schustereder, Villach (AT); Helmut Oefner, Zorneding (DE); Hans-Joachim Schulze, Taufkirchen (DE); Sandeep Walia, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/379,243

(22) Filed: Dec. 14, 2016

(65) Prior Publication Data

US 2017/0170028 A1 Jun. 15, 2017

(30) Foreign Application Priority Data

Dec. 15, 2015 (DE) .................. 10 2015 121 890

(51) Int. Cl.
*H01L 21/322* (2006.01)
*H01L 21/02* (2006.01)
*H01L 21/223* (2006.01)
*H01L 21/306* (2006.01)
*H01L 21/265* (2006.01)

(52) U.S. Cl.
CPC .... *H01L 21/3225* (2013.01); *H01L 21/02532* (2013.01); *H01L 21/02592* (2013.01); *H01L 21/02598* (2013.01); *H01L 21/2236* (2013.01); *H01L 21/26506* (2013.01); *H01L 21/30604* (2013.01)

(58) Field of Classification Search
CPC .......... H01L 21/3225; H01L 21/02532; H01L 21/02592; H01L 21/02598; H01L 21/2236; H01L 21/30604
See application file for complete search history.

(56) References Cited

U.S. PATENT DOCUMENTS

| | | | |
|---|---|---|---|
| 9,312,120 B2 | 4/2016 | Schulze et al. | |
| 2004/0235264 A1* | 11/2004 | Forbes | H01L 21/26506 438/429 |
| 2005/0037596 A1* | 2/2005 | Erokhin | H01L 21/3226 438/471 |
| 2009/0017291 A1* | 1/2009 | Sadamitsu | C30B 15/00 428/336 |
| 2009/0197396 A1* | 8/2009 | Qu | H01L 21/3225 438/473 |
| 2011/0298083 A1* | 12/2011 | Yoneda | H01L 21/3226 257/506 |
| 2014/0117502 A1 | 5/2014 | Laven et al. | |

FOREIGN PATENT DOCUMENTS

DE 102015114361 A1 3/2016

* cited by examiner

*Primary Examiner* — Karen Kusumakar
(74) *Attorney, Agent, or Firm* — Murphy, Bilak & Homiller, PLLC

(57) ABSTRACT

Disclosed is a method for processing a semiconductor wafer. The method includes forming an oxygen containing region in the semiconductor wafer, wherein forming the oxygen containing region includes introducing oxygen via a first surface into the semiconductor wafer. The method further includes creating vacancies at least in the oxygen containing region and annealing at least the oxygen containing region in an annealing process so as to form oxygen precipitates.

33 Claims, 4 Drawing Sheets

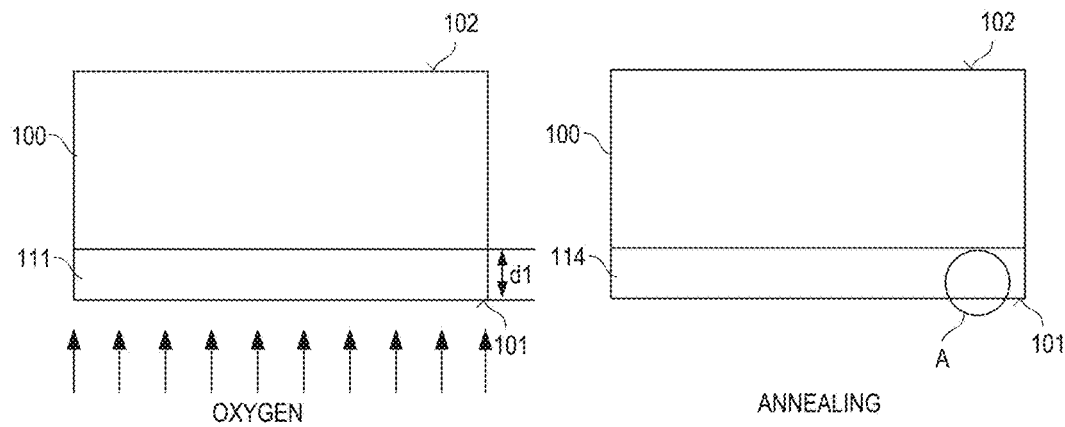
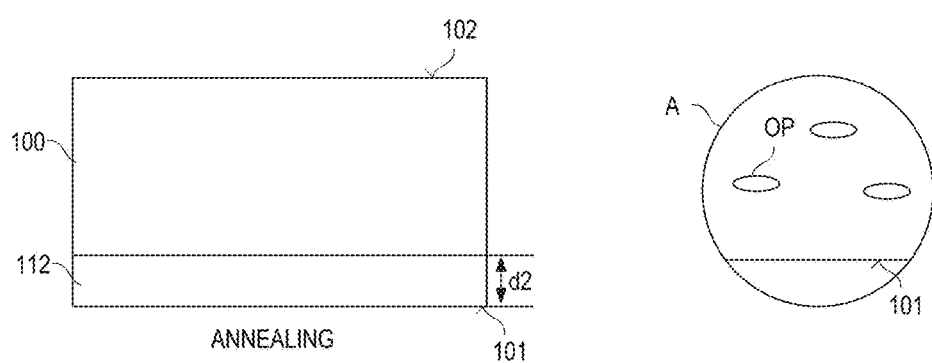
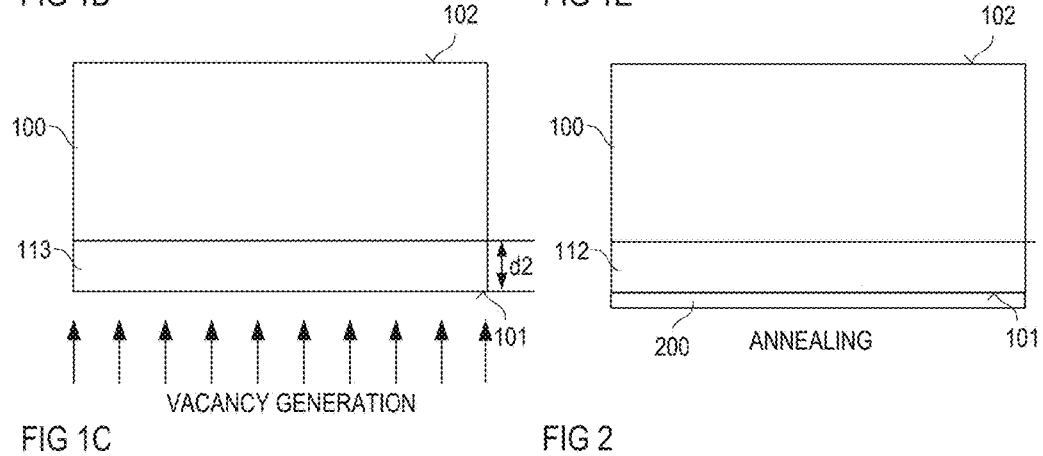

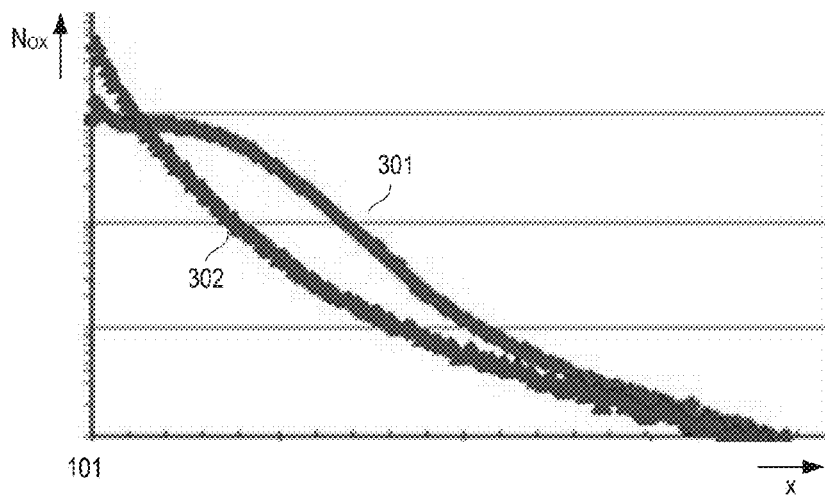
FIG 3
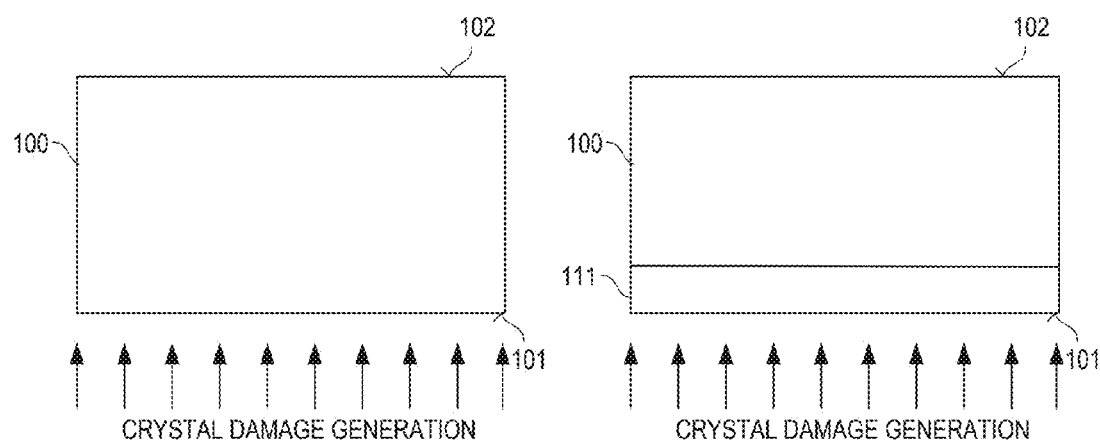
FIG 4
FIG 5

US 9,934,988 B2

METHOD FOR PROCESSING A SILICON WAFER

TECHNICAL FIELD

This disclosure in general relates to processing a silicon wafer, in particular forming gettering centers for impurities in a silicon wafer.

BACKGROUND

Producing a semiconductor device based on a silicon semiconductor wafer may include a plurality of process sequences in which, for example, doped regions are formed in the wafer and metallization layers are formed on the wafer. During such processing undesired impurities such as metal atoms may end up in the wafer. Consequently, these impurities may unduly affect the operation of the finished semiconductor device. For example, in a power semiconductor device impurities may reduce the voltage blocking capability if they end up in a region of the device where in operation of the device high electric field strengths may occur.

A polysilicon layer formed on a surface of the wafer may getter those impurities, and may be removed after the impurity introducing processing so as to remove the impurities. However, for some wafer types a process for forming a polysilicon layer on the wafer surface is not available. There is therefore a need for an alternative impurity gettering.

SUMMARY

One embodiment relates to a method. The method includes forming an oxygen containing region in a semiconductor wafer, creating vacancies at least in the oxygen containing region, and annealing at least the oxygen containing region in a first annealing process so as to form oxygen precipitates. Forming the oxygen containing region comprises introducing oxygen via a first surface into the semiconductor wafer.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIGS. 1A-1E illustrate a method according to one example for forming gettering centers in a semiconductor water;

FIG. 2 illustrates an optional further process step in the method shown in FIGS. 1A-1E;

FIG. 3 illustrates an oxygen concentration in a semiconductor wafer obtained by two different methods;

FIG. 4 illustrates an optional further process step in the method shown in FIGS. 1A-1E;

FIG. 5 illustrates an optional further process step in the method shown in FIGS. 1A-1E;

DETAILED DESCRIPTION

Figure 6:
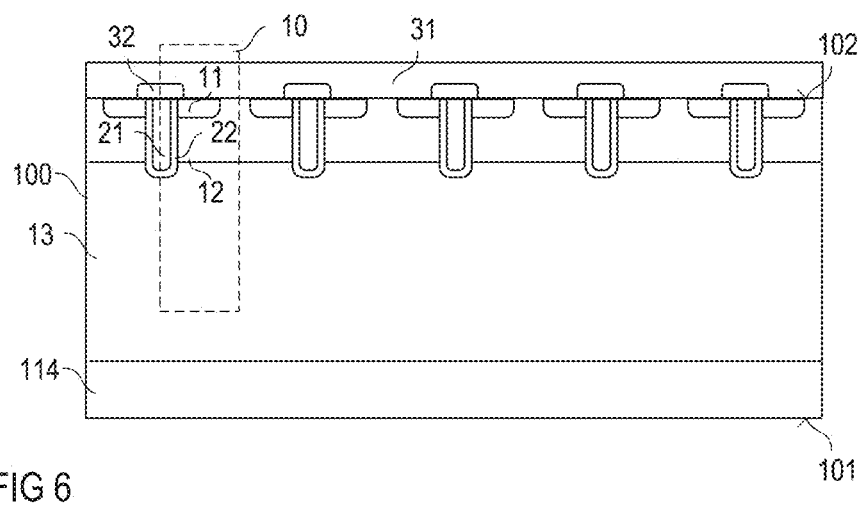
FIG. 6 shows the semiconductor wafer shown in FIG. 1E after forming transistor cells.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

FIGS. 1A-1E illustrate a method according to one example for forming gettering centers in a semiconductor wafer 100. FIGS. 1A-1D show horizontal cross sectional views of a section of the semiconductor wafer 100 during different process steps, and FIG. 1E shows an enlarged view of one section of the wafer 100 shown in FIG. 1D. The wafer 100 includes a first surface 101 and a second surface 102 opposite the first surface. FIGS. 1A-1D show the wafer 100 in a vertical section plane, which is a section plane perpendicular to the first surface 101 and the second surface 102, respectively.

According to one example, the wafer 100 is one of a CZ, an MCZ wafer and an FZ wafer. A CZ wafer is a wafer that has been cut from a single crystal (or ingot) produced in accordance with the CZ (Czochralski) method. An MCZ wafer is a wafer that has been cut from a single crystal (or ingot) produced in accordance with the MCZ (Magnetic Czochralski) method. An FZ wafer is a wafer that has been cut from a single crystal (or ingot) produced in accordance with the FZ (Float Zone) method. Those types of silicon wafers usually include an oxygen concentration of less than $4E17$ $cm^{-3}$ in case of an MCZ material or less than $1E16$ in case of an FZ material. According to one example, the wafer has a diameter of 12 inches or more. The "diameter" is the dimension of the wafer in a lateral plane, Which is a plane parallel to the first and second surfaces 101, 102.

The method for forming the gettering centers includes forming an oxygen containing region 112 in the semiconductor wafer 100. Referring to FIGS. 1A and 1B this may include introducing oxygen via the first surface 101 into the semiconductor wafer 100, and annealing in a first annealing process at least a region 111 into which the oxygen has been introduced. The "width" d1 of the oxygen containing region 111 is the dimension of the oxygen containing region 111 in a vertical direction of the semiconductor body 100 which is a direction perpendicular to the first surface 101. In this first annealing process, the oxygen introduced into the semiconductor body 100 diffuses so as to form an oxygen containing region 112. According to one example, the oxygen containing region 112 is produced to have a width d2 of between 0.1 micrometers ($\mu m$) and 10 micrometers, in particular between 1 micrometer and 5 micrometers. The "width" d2 of the Oxygen containing region 112 is the dimension of the oxygen containing region 112 in a vertical direction of the semiconductor body 100 which is a direction perpendicular to the first surface 101. The width d2 of the oxygen containing region 112 is typically equal to or larger than the width d1 of the oxygen containing region 111. According to one example, a temperature of the annealing process is higher than 1100° C., higher than 1200° C., or higher than 1250° C. According to one example a temperature of the annealing process is selected from a range of between 1100° C. and 1400° C. According to one example, the temperature in the annealing process is higher than 1200° C. and a duration of this annealing process is between 1 hour and 10 hours.

According to one example, the oxygen is introduced via the first surface 101 by implanting oxygen ions into the semiconductor body 100. According to one example this implantation can be performed using a MAD (Plasma Doping) implantation process. An implantation dose can be selected dependent on a desired oxygen concentration that is to be obtained by the implantation process and the depth d2 of the oxygen containing region 112 where this oxygen concentration is to be obtained. According to one example, the oxygen containing region 112 is produced such that the oxygen concentration in this oxygen containing region 112 is at least $5E17$ $cm^{-3}$, and a depth d2 of the oxygen containing region is between 5 micrometers and 20 micrometers. In this case, the implantation dose is selected from between at least $2.5E14$ $cm^{-2}$ ($=5E17$ $cm^{-3} \times 5E-4$ cm) and at least $1E15$ $cm^{-2}$ ($=5E17$ $cm^{-3} \times 20E-4$ cm) dependent on the depth d2. That is, after the annealing process a minimum oxygen concentration in the oxygen containing region 112, which begins at the first surface 101 and has a width d2, is at least $5E17$ $cm^{-3}$. It should be noted that the oxygen concentration outside the oxygen containing region 112 as defined above is not necessarily zero, but is below the minimum oxygen concentration mentioned above such as $5E17$ $cm^{-3}$. For example, outside the oxygen containing region 112 the oxygen concentration may decrease from the minimum level (at the border of the oxygen containing region 112) to a level below the minimum level. This level below the minimum level may correspond to the oxygen level the semiconductor body 100 has before oxygen is introduced. The oxygen in the oxygen containing region 112 is mostly in the form of interstitial oxygen. Less than 20% of the oxygen is in a non-interstitial form. In general, the implantation dose, which is given by the product of the depth d2 and the desired oxygen concentration, is selected from between $1E14$ $cm^{-2}$ and $1E18$ $cm^{-2}$. Referring to FIG. 1C, the method further includes creating vacancies at least in the oxygen containing region 112. In FIG. 1C, reference character 113 denotes a region that results from the oxygen containing region 112 by additionally creating vacancies and, therefore, includes oxygen and vacancies, This region is referred to as oxygen and vacancy containing region 113 in the following. "Vacancies" are vacancies in a crystal lattice of the semiconductor wafer 100. According to one example, creating the vacancies includes creating a vacancy concentration of between $1E17$ $cm^{-3}$ and $1E19$ $cm^{-3}$ in the oxygen and vacancy containing region 113. Creating the vacancies may include implanting particles via one of the first surface 101 and the second surface 102 into the oxygen containing region 112. For example, the particles are protons (hydrogen ions) or helium (He) ions. According to one example, the particles are implanted via the first surface 101, and an implantation dose is selected from a range of between $5E13$ $cm^{-2}$ and $1E15$ $cm^{-2}$. For example, the implantation energy is selected from a range of between 1 MeV and 5 MeV if the implanted particles are protons and between 3 MeV and 10 MeV if the implanted particles are helium ions.

The method further includes forming oxygen precipitates in the oxygen and vacancy containing region 113. Forming these oxygen precipitates includes a further annealing process. In this further annealing process at least the oxygen and vacancy containing region 113 is annealed. A temperature in the further annealing process is, for example, selected from a range of between 600° C. and 1050° C. A duration of the further annealing process may be selected from a range of between 1 hour and 30 hours. According to one example, the further annealing process includes heating at least the oxygen and vacancy containing region 113 at first to a temperature of between 750° C. and 850° C. for between 1 hour and 5 hours, and then to a temperature of between 950° C. and 1100° C. for between 1 hour and 10 hours.

FIG. 1D shows the wafer after forming the oxygen precipitates, wherein reference character 114 denotes a precipitate containing region, that is, a region that includes oxygen precipitates. Those oxygen precipitates OP are schematically illustrated in FIG. 1E that shows an enlarged detail of the precipitate containing region 114. The oxygen precipitates OP act as gettering centers for gettering impurities that may be introduced into the semiconductor wafer 100 during process steps that form one or more semiconductor devices in the wafer 100. According to one example, the further annealing process is part of producing the semiconductor device(s). That is, after creating the vacancies by implanting the particles there are process steps which are part of forming the semiconductor device(s) before performing the further annealing process. Those process steps may include implanting dopant atoms. In this case, the further annealing process serves both, to generate the oxygen precipitates and to activate the implanted dopant atoms.

Experiments have demonstrated that vacancies induced by the particle irradiation explained with reference to FIG. 1C enable large oxygen precipitates. This is because vacancies enable a fast growth of oxygen precipitates. That is, those oxygen precipitates OP generated in regions with a high vacancy concentration, such as the oxygen and vacancy containing region 113, are larger than oxygen precipitates generated in regions without (or with a lower concentration of) vacancies. Those larger oxygen precipitates OP have a higher temperature stability than smaller oxygen precipitates generated without "vacancy support" by particle irradiation.

If protons are used as particles for creating the vacancies, most of these protons diffuse out of the semiconductor wafer 100 in the further annealing process. Further, the further annealing process causes most of the vacancies generated in the oxygen and vacancy containing region 113 to diffuse out of the semiconductor wafer 100 or to recombine with silicon interstitials, so that damages caused by the particle implantation in the first region 110 are "repaired".

Referring to FIG. 2, the method optionally includes forming a coating layer 200 on the first surface 101 after introducing the oxygen explained with reference to FIG. 1A, and before the annealing process explained with reference FIG. 1B. This covering layer 200 is in place during the annealing process. The covering layer serves to reduce an out-diffusion of oxygen from the semiconductor wafer 100 via the first surface 101 during the annealing process. According to one example, the coating layer 200 is one of an amorphous silicon layer, a monocrystalline silicon layer, an oxygen containing layer such as a silicon-oxide layer deposited by chemical vapor deposition (CVD), a nitrogen containing layer such as a silicon-nitride deposited by CVD, and a layer containing silicon oxygen and nitrogen. Experiments have demonstrated that this barrier layer against outdiffusion of oxygen atoms is very beneficial with regard to obtaining a high density of oxygen precipitates. The oxygen can be introduced via the first surface 101 using an implantation process. According to one example, the implantation process is a beamline implantation process. According to another example, the implantation process is a plasma doping (PLAD) process. Such implantation processes are commonly known. For example, such implantation processes are described in A. Renau, J. T. Scheuer: "Comparison of Plasma Doping and Beamline Technologies for Low Energy Ion Implantation", Proceedings of the 14th International Conference on Ion Implantation Technology. 2002 ISBN 0-7803-7155-0.

In FIG. 3, curve 301 schematically illustrates an oxygen concentration that can be obtained by a beamline implantation process, and curve 302 shows an oxygen concentration that can be obtained by a PLAD process. Each of these curves illustrates the oxygen concentration in a vertical direction x, which is a direction perpendicular to the first surface 101, and beginning at the first surface 101. Curves 301 and 302 show the oxygen concentration after introducing the oxygen and before the annealing process. In the annealing process the oxygen diffuses deeper into the semiconductor body resulting in a more homogenous oxygen distribution in the oxygen containing region 113 shown in FIG. 1B. By using a PLAD implantation process for implanting the oxygen much higher implantation doses at lower cost can be reached as compared to typical beamline implantation processes.

The method may further include generating additionally or alternatively crystal damages in a region adjacent the first surface 101. Generating those crystal damages may include implanting particles via the first surface 101, wherein these particles are selected such that they are capable of generating crystal damages in the semiconductor wafer 100. Referring to FIG. 4, those crystal damages may be generated before the oxygen is introduced. Alternatively, referring to FIG. 5, the crystal damages are generated after the oxygen has been introduced.

According to one example, the particles implanted into the semiconductor wafer 100 in order to generate crystal damages are silicon atoms (silicon ions). According to another example, the particles are oxygen atoms (oxygen ions). These particles are implanted with an implantation energy which is high enough for the particles to generate crystal damages. According to one example, the implantation energy is selected from a range of between 1 MeV and 5 MeV. In this process, implantation doses are typically lower than in the implantation process described with reference to FIG. 1A and implantation energies are typically higher. According to one example, the implantation energy is selected from a range of between 0.5 MeV and 4 MeV. In order to obtain damages deep in the semiconductor body 100 at low implantation energies a channeling effect may be used. That is, the particles may be implanted under a certain angle relative to the first surface 101 such that particles may move along a crystal plane of a crystal lattice of the semiconductor body.

FIG. 6 shows a vertical cross sectional view of the semiconductor wafer 100 after a further processing in which transistor cells 10 of a transistor device have been implemented in the semiconductor wafer 100 in a region adjoining the second surface 102, and on the second surface 102, respectively. During this processing, impurities such as, for example, metal atoms may be introduced into the semiconductor wafer 100. The oxygen precipitates in the oxygen precipitate containing region 114 act as gettering centers for those impurities. That is, those impurities are "captured" by the gettering centers in order to prevent those impurities from negatively affecting operation of the finished semiconductor device.

Referring to FIG. 6, each of the transistor cells 10 includes a source region 11, a body region 12 and a drift region 13, wherein the drift region 13 is shared by the individual transistor cells. Furthermore, each transistor cell includes a gate electrode 21 adjacent the body region 12 and dielectrically insulated from the body region 12 by a gate dielectric 22. A source electrode 31 is electrically connected to the body regions 12 and the source regions 11 of the individual transistor cells 10 and is electrically insulated from the gate electrode 21 by an insulation layer 32. Just for the purpose of illustration the transistor cells 10 are drawn as trench transistor cells in the example shown in FIG. 6. That is, the gate electrodes 21 of these transistor cells are arranged in trenches extending from the surface 102 into the semiconductor body 100. In the finished transistor device the individual transistor cells 10 are connected in parallel by having the source regions 11 and the body regions 12 connected to a source node via the source electrode 31, and by having the gate electrodes 21 connected to a common gate node G. The transistor device can be implemented as an n-type or as a p-type transistor device. In an n-type transistor device the source regions 11 and the drift region 13 are n-doped while the body region 12 are p-doped. In a p-type transistor device the source regions 11 and the drift region 13 are p-doped and the body regions 12 are n-doped.

In the example shown in FIG. 6, the drift region 13 has a doping that corresponds to a basic doping of a semiconductor wafer 100. The "basic doping" of the semiconductor wafer 100 is a doping the semiconductor wafer 100 has after it has been cut from the ingot and before the processing explained herein before takes place.

Figure 7:
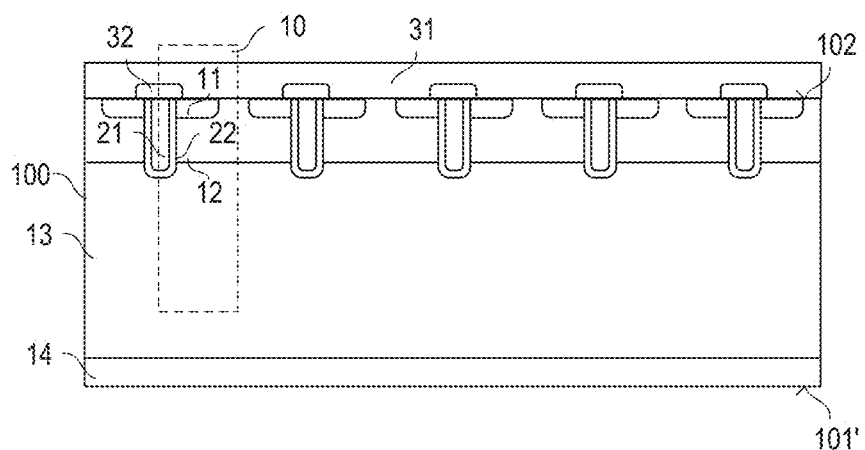
FIG. 7 shows the semiconductor wafer shown in FIG. 6 after removing an oxygen precipitate containing region.

FIG. 7 shows the semiconductor wafer 100 shown in FIG. 6 after further process steps in which the precipitate containing region 114 is removed and a drain region 14 is formed. Removing the precipitate containing region 114 may include at least one of a mechanical grinding process, an etching process, a mechanical polishing process, a chemical polishing process or a chemical mechanical polishing (CMP) process. Each of these processes reduces a thickness of the semiconductor wafer 100 so as to remove the precipitate containing region 114. Through this, the impurities gettered by the oxygen precipitates in the precipitate containing region 114 are removed. The etching rate in the region containing the oxygen precipitates is much higher than in the region containing no oxygen precipitates. Thus, an etching process can stop self-adjusted close to the end of the region containing oxygen precipitates so that a self-adjusted thinning of the semiconductor body 100 can be obtained. Forming the drain region 14 may include an implantation and/or diffusion process in which dopant atoms are introduced via a surface 101' into the semiconductor wafer 100. Surface 101' is opposite the second surface 102 and is the surface that is formed by removing the oxygen precipitate containing region 114. The drain region 14 may have the same doping type as the drift region 13 in order to form a MOSFET (Metal Oxide Semiconductor Field-Effect Transistor) or may have a doping complementary to the doping type of the drift region 13 in order to form an IGBT (Insulated Gate Bipolar Transistor).

Figure 8:
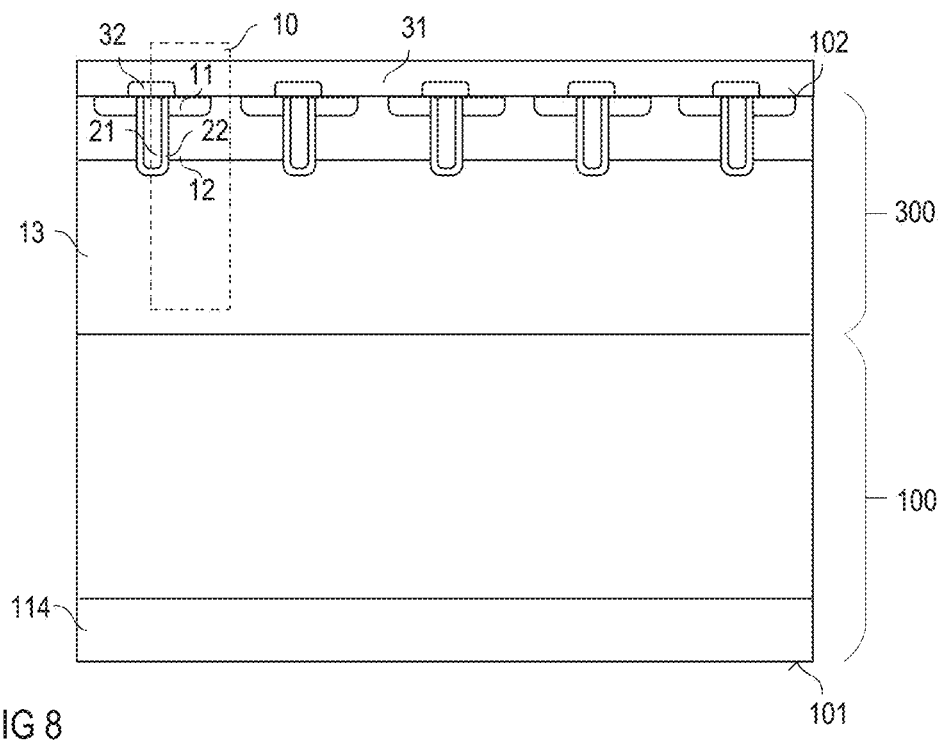
FIG. 8 shows the semiconductor wafer shown in FIG. 1E after forming an epitaxial layer and forming transistor cells.

FIG. 8 shows a vertical cross sectional view of a semiconductor wafer according to another example. The wafer shown in FIG. 8 includes the wafer 100 explained herein before and an epitaxial layer 300 formed on the wafer 100. Active device structures of a semiconductor device are integrated in the epitaxial layers 300 in this example. Just for the purpose of illustration the semiconductor device is again a transistor device with a plurality of transistor cells 10. In this example, the drift region 13 which is shared by the individual transistor cells 10, is formed by the epitaxial layer 300.

Figure 9:
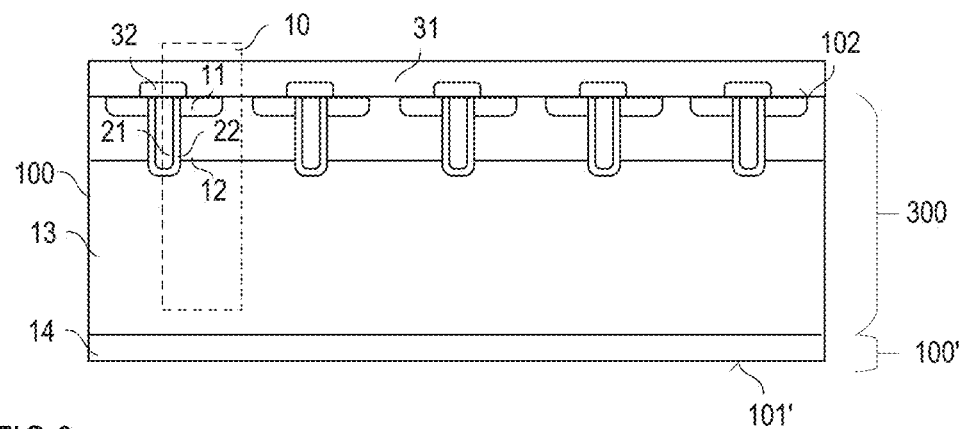
FIG. 9 shows the semiconductor wafer shown in FIG. 8 after removing an oxygen precipitate containing region.

FIG. 9 shows the wafer shown in FIG. 8 after a further processing. This further processing includes thinning the water 100 in order to remove at least the precipitate containing region 114. A remaining section of the wafer 100 forms the drain region of the transistor device. In this case, the wafer 100 has a basic doping that corresponds to the doping of the drain region 14.

According to one example, the semiconductor wafer 100 includes only one semiconductor device. According to another example, the wafer 100 includes a plurality of different semiconductor devices. In this case the wafer 100 can be subdivided into the individual semiconductor devices after the processing explained with reference to FIGS. 6-9.

It should be noted that forming one or more transistor devices (wherein each transistor device may include a plurality of transistor cells) is only one of a plurality of different examples of semiconductor devices that can be integrated in the semiconductor wafer 100. Just for the purpose of illustration FIGS. 6-9 show a transistor device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    forming an oxygen containing region in a semiconductor wafer, wherein forming the oxygen containing region comprises introducing oxygen via a first surface into the semiconductor wafer;
    creating vacancies at least in the oxygen containing region, by implanting particles into the semiconductor wafer; and
    annealing at least the oxygen containing region in an annealing process so as to form oxygen precipitates.

2. The method of claim 1, wherein the semiconductor wafer is one of a CZ wafer, an MCZ wafer, and an FZ wafer.

3. The method of claim 1, wherein forming the oxygen containing region further comprises:
    diffusing the introduced oxygen in a further annealing process.

4. The method of claim 3,
    wherein a temperature in the further annealing process is in a range between 1050° C. and 1300° C., and
    wherein a duration of the further annealing process is in a range between 1 hour and 20 hours.

5. The method of claim 4, wherein the temperature in the further annealing process is higher than 1100° C.

6. The method of claim 1, wherein the oxygen-containing region is formed to extend between 0.1 and 20 micrometers from the first surface into the semiconductor wafer.

7. The method of claim 6, wherein the oxygen containing region is formed to extend between 1 and 5 micrometers from the first surface into the semiconductor wafer.

8. The method of claim 1, wherein the oxygen containing region is formed to have an oxygen concentration of at least 5E17 atoms/cm$^{-3}$.

9. The method of claim 1, wherein introducing the oxygen comprises implanting oxygen ions via the first surface into the semiconductor wafer.

10. The method of claim 9, wherein implanting the oxygen ions comprises a plasma doping implantation process.

11. The method of claim 10,
    wherein an implantation energy for implanting the oxygen ions is in a range between 0.5 keV and 10 keV, and
    wherein an implantation dose for implanting the oxygen ions is in a range between 1E14 cm$^{-2}$ and 1E18 cm$^{-3}$.

12. The method of claim 1, wherein the vacancies at least in the oxygen containing region have a vacancy concentration in a range between 1E17 cm$^{-3}$ and 1E19 cm$^{-3}$.

13. The method of claim 1, wherein implanting the particles comprises implanting the particles via the first surface or via a second surface opposite the first surface.

14. The method of claim 1, wherein the particles comprise at least one of protons and helium ions.

15. The method of claim 14,
    wherein an implantation energy for implanting the particles is in a range between 1 MeV and 5 MeV if the implanted particles are protons, or
    wherein the implantation energy is in a range between 3 MeV and 10 MeV if the implanted particles are helium ions.

16. The method of claim 13, wherein the particles are implanted at an implantation dose of between 5E13 cm$^{-2}$ and 1E15 cm$^{-2}$.

17. The method of claim 2, further comprising:
    forming a coating layer on the first surface after introducing the oxygen and before the annealing process.

18. The method of claim 17, wherein the coating layer is selected from the group consisting of:
    an amorphous silicon layer;
    a monocrystalline silicon layer;
    an oxygen containing layer; and
    a nitrogen containing layer.

19. The method of claim 1,
    wherein a temperature of the annealing process is in a range between 750° C. and 1100° C., and
    wherein a duration of the annealing process is in a range between 1.5 hours and 30 hours.

20. The method of claim 3, wherein the further annealing process comprises:
    heating at least the oxygen containing region to a temperature between 750° C. and 850° C. for a duration between 0.5 hours and 10 hours; and
    heating at least the oxygen containing region to a temperature between 950° C. and 1100° C. for a duration between 1 hour and 20 hours.

21. The method of claim 1, further comprising:
    generating crystal damages in the oxygen containing region.

22. The method of claim 21, wherein generating the crystal damages comprises implanting particles via the first surface into the semiconductor water before or after introducing the oxygen.

23. The method of claim 22, wherein the particles are selected from the group consisting of:
    oxygen atoms; and
    silicon atoms.

24. The method of claim 22, wherein the particles are implanted at an implantation energy in a range between 500 keV and 4 MeV and an implantation doses in a range between 1E10 cm$^{-2}$ and 1E13 cm$^{-2}$.

25. The method of claim 20, where channeling is employed during the implanting.

26. The method of claim 1, wherein a diameter of the wafer is at least 12 inches.

27. The method of claim 1, further comprising:
removing a section of the semiconductor body beginning at the first surface so as to at least partially remove the oxygen precipitates.

28. The method of claim 27, wherein removing the section of the semiconductor body comprises an etching process.

29. A method, comprising:
forming an oxygen containing region in a semiconductor wafer, wherein forming the oxygen containing region comprises introducing oxygen via a first surface into the semiconductor wafer;
creating vacancies at least in the oxygen containing region;
annealing at least the oxygen containing region in an annealing process so as to form oxygen precipitates; and
generating crystal damages in the oxygen containing region, by implanting particles via the first surface into the semiconductor wafer before or after introducing the oxygen.

30. The method of claim 29, wherein the particles are selected group consisting of oxygen atoms and silicon atoms.

31. The method of claim 29, wherein the particles are implanted at an implantation energy in a range between 500 keV and 4 MeV and an implantation doses in a range between $1E10$ $cm^{-2}$ and $1E13$ $cm^{-2}$.

32. A method, comprising:
forming an oxygen containing region in a semiconductor wafer, wherein forming the oxygen containing region comprises introducing oxygen via a first surface into the semiconductor wafer;
creating vacancies at least in the oxygen containing region;
annealing at least the oxygen containing region in an annealing process so as to form oxygen precipitates; and
removing a section of the semiconductor body beginning at the first surface so as to at least partially remove the oxygen precipitates.

33. The method of claim 32, wherein removing the section of the semiconductor body comprises an etching process.

* * * * *

UNITED STATES PATENT AND TRADEMARK OFFICE
CERTIFICATE OF CORRECTION

PATENT NO. : 9,934,988 B2  
APPLICATION NO. : 15/379243  
DATED : April 3, 2018  
INVENTOR(S) : W. Schustereder et al.

Page 1 of 1

It is certified that error appears in the above-identified patent and that said Letters Patent is hereby corrected as shown below:

In the Claims

Column 8, Line 11 (Claim 11, Line 5), please change "$cm^{-3}$." to -- $cm^{-2}$. --.
Column 8, Line 66 (Claim 24, Line 3), please change "doses" to -- dose --.
Column 10, Line 2 (Claim 30, Line 2), please change "selected group" to -- selected from the group --.
Column 10, Line 6 (Claim 31, Line 3), please change "doses" to -- dose --.

Signed and Sealed this
Fifth Day of June, 2018

Andrei Iancu
*Director of the United States Patent and Trademark Office*